United States Patent
Cook, III et al.

(10) Patent No.: US 6,851,076 B1
(45) Date of Patent: Feb. 1, 2005

(54) MEMORY TESTER HAS MEMORY SETS CONFIGURABLE FOR USE AS ERROR CATCH RAM, TAG RAM'S, BUFFER MEMORIES AND STIMULUS LOG RAM

(75) Inventors: John H Cook, III, Fort Collins, CO (US); Stephen D Jordan, Ft Collins, CO (US); Preet P Singh, Freemont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 532 days.

(21) Appl. No.: 09/672,650

(22) Filed: Sep. 28, 2000

(51) Int. Cl.[7] .............................................. G11C 29/00
(52) U.S. Cl. ...................................................... 714/718
(58) Field of Search ................................ 714/718–719, 714/732, 735–736; 365/200–201

(56) References Cited

U.S. PATENT DOCUMENTS 5,422,892 A * 6/1995 Hii et al. .................... 714/735
6,055,661 A * 4/2000 Luk ............................ 714/736

* cited by examiner

Primary Examiner—Shelly A Chase
(74) Attorney, Agent, or Firm—Edward L. Miller

(57) ABSTRACT

The various functions that are desirable for interior test memory within a memory tester are implemented in Memory Sets each serving as the host for one or sometimes more of such functions. For certain classes of testing a portion of interior test memory can be used as a Stimulus Log RAM that operates as an ideal DUT to create the correct conditions that are to exist in an actual DUT after testing. The actual part can then be tested, while the expected receive vectors are taken from the Stimulus Log RAM, and the comparison results sent to an ECR, Tag RAM's, etc., as usual. In this way the test program does not have to create or contain within itself the particular receive vectors that are the expected response from the applied stimulus.

9 Claims, 11 Drawing Sheets

MEMORY TESTER HAS MEMORY SETS CONFIGURABLE FOR USE AS ERROR CATCH RAM, TAG RAM'S, BUFFER MEMORIES AND STIMULUS LOG RAM

REFERENCE TO RELATED APPLICATION

This disclosure is related to information appearing in U.S. patent application Ser. No. 09/665,892 entitled ERROR CATCH RAM FOR MEMORY TESTER HAS SDRAM MEMORY SETS CONFIGURABLE FOR SIZE AND SPEED, filed 20 Sep. 2000, and issued on 20 Nov. 2001. For the reasons given below that Patent is hereby expressly incorporated herein by reference. The subject matter of the instant disclosure concerns a portion of the operation of a rather large and complex system for testing semiconductor memories. The memory tester described contains within itself an extensive memory subsystem as a component in the overall paradigm for performing tests. Certain capabilities of that memory subsystem are of interest here, in that they serve as the preferred basis for some of the novel subject matter to be disclosed. For reasons of economy in the product, and abetted by the desire to have large amounts of memory available within the tester, a way was developed to use inexpensive memory (DRAM that is slow when randomly accessed) as a substitute for expensive SRAM that is fast even when randomly addressed. The result, when combined with various other memory subsystem features, is a very complex affair involving multiplexing among Groups and interleaving among Banks, as well as implementing such things as variable word width. On the one hand, the particular features we seek to disclose here could be implemented in a system using only SRAM, with a considerable reduction in complexity. There would be a considerable economic penalty, however, which would likely cause the finished product to be an engineering curiosity instead of a viable commercial technique. We have taken a middle ground in this disclosure, where we do not pretend to make the system entirely out of SRAM, although that would certainly be operable. We include the DRAM technique as a matter of course, but we have suppressed much of the messy detail about the internal operation of that DRAM technique, in favor of a modest description of its basic principles. Even a casual reader will conclude that much interesting material (e.g., the different interleaving and addressing schemes and their connection to the different modes of operation) has been omitted. However, every reader will, upon reflection, appreciate that the techniques and features that we seek to disclose do not fundamentally depend on that omitted material, even though they may, in some cases, be slightly influenced by it. So we have a case of ragged edges that are peripheral to the main issues of interest. The disclosure incorporated above supplies an abundance of detail concerning the DRAM technique. Those that feel that the instant disclosure raises more issues about the memory subsystem than it answers can go to the incorporated disclosure for those answers. It is for that reason that its existence has been made known by being incorporated herein by reference.

That said, there is a caveat for those who wish to combine the teachings of the two disclosures. The incorporated disclosure takes the view that the totality of the memory of interest is called an Error Catch RAM (ECR) and that it is divided into Memory Sets. This point of view works without difficulty in the incorporated disclosure, since in that disclosure an ECR is nearly the sole memory function of interest, even though the existence of other such functions is alluded to. However, upon reflection during the preparation of the instant application it was found to be more convenient to describe the totality of memory of interest using the term "Interior Test Memory," which is in turn composed of four separate and independent Memory Sets, within which the various functional memory mechanisms (including an ECR) could be defined by suitable configuration. So it would appear that in the incorporated disclosure Memory Sets are contained in an ECR, while herein it is the other way around. Nevertheless, both disclosures are directed to subject matters found in the same overall system. The difference is largely a matter of terminology, and any seeming inconsistency between the two disclosures vanishes when it is the lower level details of memory subsystem operation that are being considered. And it is to make those details available to the interested reader that we have pointed to that incorporated disclosure.

BACKGROUND OF THE INVENTION

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. Memory testers frequently run continuously, and test time is considered a major factor in the cost of the final part. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and use logical methods to isolate portions of the pattern that do not perform as expected. A test pattern that is generated algorithmically using instructions and commands that are repeated in programming loops consume less space in tester memory. Accordingly, it is desirable to have algorithmic test pattern generation capability in a memory tester.

Precise signal edge placement and detection is also a consideration in the effectiveness of a non-volatile memory tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from in the Device Under Test (memory).

Memory testers are said to generate transmit vectors that are applied (stimulus) to the DUT (Device Under Test), and receive vectors that are expected in return (response). The algorithmic logic that generates these vectors can generally do so without troubling itself about how a particular bit in a vector is to get to or from a particular signal pad in the DUT. At this level it is almost as if it were a certainty that adjacent bits in the vector would end up as physically adjacent signals on the DUT. Life should be so kind!

In reality, the correspondence between bits in a vector at the "conceptual level" and the actual signals in the DUT is apt to be rather arbitrary. If nothing were done to prevent it, it might be necessary to cross one or more probe wires as they descend from a periphery to make contact with the DUT. Such crossing is most undesirable, and it is conventional to incorporate a mapping mechanism in the path of the transmit vector to rearrange the bit positions in the transmit vector before they are applied to the DUT, so that task of making physical contact is not burdened with crossings. Receive vectors are correspondingly applied to a reverse mapping mechanism before being considered. In this way the algorithmic vector generation and comparison mechanisms can be allowed to ignore this entire issue. As another example of what such mappers and reverse mappers can do, consider the case when a different instance of the same type of DUT is laid out on the same wafer, but with a rotation or some mirrored symmetry, in order to avoid wasting space on the wafer. These practices also have an effect on the correspondence between vector bit position and physical signal location, but which can be concealed by the appropriate mappings and reverse mappings. It will be appreciated that the mappings and reverse mappings needed for these situations are, once identified for a particular DUT, static, and need not change during the course of testing for that particular DUT.

Memory testers have interior test memory that is used to facilitate the test process. This interior test memory may be used for several purposes, among which are storing transmit vectors ahead of time, as opposed to generating them in real time, storing receive vectors, and storing a variety of error indications and other information concerning DUT behavior obtained during testing. (There are also housekeeping purposes internal to the operation of the memory tester that use SRAM and that may appear to fall within the purview of the phrase "interior memory." These are private to the internal operation of the tester, tend to not be visible at the algorithmic level, and are comparable to internal control registers. That memory is described as "interior control memory," and is excluded from what is meant herein by the term "interior test memory," which we use to describe memory used to store bit patterns directly related to the stimulus of, and response from, the DUT.) It is easy to appreciate that this interior test memory needs to operate at least as fast as the tests being performed; a very common paradigm is for the interior test memory (or some portion thereof) to be addressed by the same address (or some derivative thereof) as is applied to the DUT. What is then stored at that addressed location in interior test memory is something indicative of DUT behavior during a test operation performed on the DUT at that address. Algorithmic considerations within the test program may mean that the sequence of addresses associated with consecutive transmit vectors can be arbitrary. Thus, the interior memory needs to have the dual attributes of high speed and random addressability. SRAM comes to mind immediately as being fast, easy to control and tolerant of totally random addressing. Indeed, conventional memory testers have used SRAM as their interior test memory.

Unfortunately, SRAM is quite expensive, and this has limited the amount of interior test memory with which memory testers have had to work. The result is limits on memory tester functionality that are imposed by a shortage of memory. DRAM is significantly less expensive, but cannot tolerate random addressing and still perform at high speed. DRAM is internally organized to require the lengthy pre-charging of an addressed "row" with RAS (Row Address Strobe), followed by specifying an addressed "column" with CAS (Column Address Strobe). A memory controller converts a unified address into row and column components to be applied with RAS and CAS. DRAM is often suitably fast if, once a row has been pre-charged, further addressing can be confined to columns along that row (i.e., further instances of CAS, but none of RAS). However, such an algorithmic restriction on tester operation (which interferes with the ability to arbitrarily address the DUT) is generally unacceptable, and therefore cannot be relied on to provide the high speed operation needed for use as interior test memory within a memory tester. It would be desirable if by using DRAM the size of the interior test memory could be both increased and its costs reduced, which benefits could be realized if there were a way to operate DRAM's with arbitrary addressing at the same rate as commonly expected of the more expensive SRAM's.

DRAM can replace SRAM as the interior test memory in a memory tester. As described in greater detail below, the problem of increasing the speed of DRAM operation for use as interior test memory can be solved by increasing the amount of DRAM used, in place of increasing its speed. Numbers of identical Banks of DRAM are treated as Groups. A combination of interleaving signals for different Banks of memory in a Group thereof and multiplexing between those Groups of Banks slows the memory traffic for any one Bank down to a rate that can be handled by the Bank. (For the reader's convenience, we include a brief summary of this technique here, since much of its architectural aspects and associated terminology are useful in the explanation that follows.)

A three-way multiplexing between three Groups of four Banks each, combined with a flexible four-fold interleaving scheme for signal traffic to a Group produces an increase in operating speed approaching a factor of twelve, while requiring only three memory busses. A round robin strategy for choosing the next Group for the multiplexer is simple and assures that the interleaving mechanism for each Group has the time it needs to complete its most recently assigned task. All interleaved accesses within a Group are performed upon a next Bank (within that Group), also selected by a simple round robin selection. In this configuration, each of the twelve Banks represents a duplicate instance of the entire available address space, and any individual write cycle might end up accessing any one of the twelve Banks. An implication is that, at the conclusion of testing, all twelve-Banks must be investigated to learn what failures happened during testing of the DUT, since the history of any address or collection of addresses of interest will be spread out across all twelve Banks. A particular channel is thus represented by twelve bits (one bit from each Bank and whose bit position within the word for that Bank is determined by the channel).

It would be, however, awkward to have to (manually, as it were) individually consult all twelve Banks to discover failure information, so a utility mechanism has been provided to automatically "compose" (merge) results of all twelve Banks during a read cycle at an address into a unified result that can be stored in one or all twelve Banks. This allows composed data to later be read at full speed. Full speed in one embodiment is a 100 MHZ rate for randomly addressed memory transactions.

If 33 MHZ is fast enough, then random access can be supported with just the interleaving and no multiplexing, in which case the composition mechanism and the memory addressing scheme are suitably adjusted. The addressing scheme changes to include extra Group selection bits that allow the depth of the memory to be three times deeper than for random 100 MHZ operation. These two modes of operation are called R100 and R33, respectively. There is also an L100 mode of 100 MHZ operation to single Banks that relies on well behaved addresses being sent to the DRAM (an absolute minimum of row address changes).

At the top level of interior test memory organization there are four Memory Sets, each having its own separate and independent address space and performing requested memory transactions. Two are of SDRAM as described above, and two are of SRAM. Each Memory Set has its own controller to which memory transactions are directed. As to externally visible operational capabilities, all four Memory Sets are essentially identical. They differ only in their size of memory space and how they are internally implemented: The SRAM Memory Sets do not employ multiplexing and interleaving, since they are fast enough to begin with. Despite their independence, Memory Sets of the same type (of SRAM or of DRAM) may be "stacked," which is to say treated a one larger address space. This is done at the level of control above the Memory Sets themselves, in the algorithmic generation of the addresses and the decision as to which Memory Set to actually send a memory transaction. It is not as automatic as the way in which the Memory Sets and their controllers can stack groups to triple the address space as between the R100 and R33 modes of operation. For each of the Memory Set controllers, it has no clue that there even is such a thing as another Memory Set with another controller.

Thus it is that the interior test memory of the tester is divided into four Memory Sets, two of which are "internal" SRAM's and two of which are "external" DRAM's. To be sure, all this memory is physically inside the memory tester; the terms "internal" and "external" have more to do with a level of integration. The SRAM's are integral parts of a VLSI (Very Large Scale Integration) circuit associated with the tester's central functional circuitry, while the DRAM's are individual packaged parts mounted adjacent the VLSI stuff. The amount of SRAM is fairly small, (say, around a megabit per Memory Set) while the amount of DRAM is substantial and selectable (say, in the range of 128 to 1024 megabits per Memory Set). The SRAM Memory Sets are always present, and may be used for any suitable purpose, such as storing the expected content of a DUT that is a ROM (Read Only Memory). The DRAM Memory Sets are actually optional, and are typically used for creating a trace for subsequent analysis leading to repair, although there are also other uses. The tester does not enforce a distinction between the SRAM and DRAM Memory Sets, as to different purposes for which they may be used. Those distinctions arise mostly as a matter of size. The SRAM Memory Sets are small, while the DRAM Memory Sets are potentially huge. The person or persons creating the test programming make the decisions concerning how the various Memory Sets are to be used.

It was mentioned above that the DUT may well be susceptible of repair. This is often true even for undiced memory chips that are still part of a wafer. How this is actually achieved on the circuit level is well understood by those who manufacture such devices, so it is sufficient for us to simply say that incorporated into those devices are some number of selectably destroyable elements whose destruction enables gating that in turn alters the internal logic of an associated circuit. This ability is used to route internal signals to replacement circuits that substitute for defective ones. This capability cannot be economically worth while unless the repair can be made with less time and effort that would be required to make a new part; otherwise it would be more cost effective to simply jettison the bad part into the scrap barrel. In particular, it is undesirable to involve a human technician in the processes of understanding the particular failures in the bad parts within a production stream and of being responsible for deciding how to repair them. Instead, an algorithmic mechanism (program and associated hardware) in the memory tester can be developed to analyze the failure and attempt its repair. The repaired part can be re-tested on the spot, and its fate decided.

Such a mode of operation has certain implications for the design of the memory tester. Real time detection of failures can be used to set flags and alter test algorithms to refine the understanding of the failure. That is, tests performed to verify proper operation might not be the ones best suited to discover why the part is failing in the first place. The memory tester needs to be able to create a trace (that is, a usable record) of test data for an automated analysis (whether performed immediately or at the conclusion of a larger test process) that determines whether to attempt a repair, and if so, what actions to take in making the repair. Typically, the attempt at repairs is postponed until after at least a preliminary testing reveals the scope or number of probable failures. The number of replacement circuits available is limited (say, half a dozen or so, as determined by an odds-driven cost benefit analysis), and there is no point in attempting to fix a part that can be shown to need more help than is available. All of this takes place in light of the understanding that "Time on the tester is $$!" and that what memory manufacturers need are testers that test thoroughly, but in an absolute minimum of time. As a consequence, the phrase "create a trace of test data for an automated analysis" describes a process that, far from being considered a unified activity, has itself been subjected to extensive analysis to minimize the time required to test a part, and if indicated, repair it. The simple conception of a memory tester as a general purpose programmable mechanism (e.g., a CPU and memory) interfaced to some controllable test bed for exercising a DUT has long since ceased to be economically viable for the high volume testing of memories. Too large a percentage of time is spent in CPU execution and the overhead logic required to generate stimuli and evaluate their responses. Much dedicated hardware has been incorporated into memory testers to enable them to run fast, and the general purpose programmable mechanism is now generally relegated to tasks concerning control at the supervisory level.

If the testing of the DUT is to be performed at high speed and without unnecessary pauses, it is clear that tester's interior test memory used to create a trace describing failures has to operate at the same high speeds used to test the DUT. In memory testers of the sort to be described herein, a portion of interior test memory that stores test response data in addresses corresponding to those tested in the DUT is called an ECR (Error Catch RAM). It is easy to see why the content of an ECR can be thought of as a trace of test results. However, it would be a mistake to construe tester operation as simply trace creation through stimulus followed by after-the-fact trace analysis that dwells on every address. While indeed useful for certain aspects of DUT testing, such a model is too slow, and for certain tasks is simply too cumbersome for high speed production testing. One central theme found in ways to augment the notion of a trace captured in an ECR is the use of dedicated hardware to categorize and index (think: recognize and then store) various errors, in real time as they happen. These various errors occur along the organizing architectural principles that are internal to the particular DUT being tested. This strategy significantly reduces the complexity of the analysis task, as well as reducing test time. This strategy uses interior test memory called Tag RAM's to store an indexed collection of detected events for later inspection.

A conventional memory tester can have many uses for interior test memories of its own, of which ECR's and Tag RAM's are but two. We now examine the nature of some of these uses for internal memories, and will arrive at the conclusion that improvement in the architecture of a conventional memory tester's interior test memory is desirable.

In operation an ECR is: (1) addressed by the same address as, or by an address derived from, the address that is applied to the DUT; and, (2) has a native data word width in bits at least that of the DUT. The effective word width is adjustable along powers of two (eight, sixteen, thirty-two), with such W adjustability accompanied by a corresponding inverse change in addressability. This feature is termed "narrow word".

When a test channel for the DUT (a bit in an output word, or some other signal of interest) compares or fails to compare to expected results a corresponding bit at that address in the ECR is either set or cleared, according to the convention in use. We store a zero to represent a failure to compare. As thus organized, the ECR has not got a multi-bit value for each address/channel combination, and can instead store just a single bit's worth of information for each such combination, no matter how many times that combination may be accessed during a test. Test strategy enters into what the bit means and how it is maintained. The bit might represent the dichotomy "it never failed/it failed at least once" for an entire multi-access test, or it might represent the outcome of the last access (i.e., test) only, even if that is at variance with earlier tests. If quantity information is desired about failures for a certain address/channel, some additional resource (a counter) must be allocated to record it.

Tag RAM's are another way of recording in a tester's interior test memory information about how the DUT responds while being tested. A Tag RAM generally has a much smaller address space than an ECR does, and is typically addressed by a "classified address" that is derived from the one applied to the DUT. The derivation reflects the existence of some organizational principle inside the DUT, and is termed "address classification" in this Specification. The data stored in the Tag RAM is formed by the detection of some condition occurring in the DUT's response to some stimulus, and is again usually derived by application of knowledge about internal DUT operation by process called "data classification". The idea is to recognize some condition or event, which is probably a member of a whole family (universe) of possible occurrences wherein different members of the family have different addresses, and then store information about test results. This produces a Tag RAM whose contents are useful abstractions related to DUT organization and that are indexed according to aspects of that. DUT organization. Different families of failure types are represent by different Tag RAM's.

As an example of a Tag RAM, consider that an address applied to the DUT might be separable into X, Y and Z components that relate to internal organization of the DUT. The address applied to the DUT has the X, Y and Z addresses embedded therein, but perhaps not in an obvious or convenient way. But suitable gating circuits can extract, say, the Y address and apply it as an address to a Tag RAM. We can now store information that is indexed according to Y address. That information might be a single bit whose end-of-test meaning is that a failure occurred at least once at that Y address, or it might be a multi-bit value having some other interpretation. By having Tag RAM's for X, Y and Z one can obtain useful information about the failures in a DUT whose internal organization includes the notions of X, Y and Z addresses. Furthermore, a significant reduction in memory requirements is realized, as the needed Tag RAM's consume a number of locations equal to only the sum of the X, Y and Z address spaces, rather than equal to their product, which is what an ECR would have to have.

To continue with this example, data classification can further increase the usefulness of Tag RAM's. Suppose that the DUT is an eight bit wide memory having internal X and Y address mechanisms. Internally the DUT is eight one-bit memories, each having the same X and Y addressing mechanisms, and each providing its output data to a different one of eight pins. It is useful to ask "For each Y address, was there ever a failure on any of those eight pins?" That is, we desire data classification that OR's those eight pins together. Our term for this mode of behavior is "compression", and clearly it needs to be configurable. Next, suppose that we have a tester that has a native word width of thirty-two bits; we can wish to test four of these eight-bit DUT's at a time by partitioning that native word width into four eight-bit segments, one for each DUT. Now we want to do the OR'ing four times, but on the four different segments as if each were the only segment, and respectively send the results to four different Tag RAM's. Our term for this mode of behavior is "masking", and clearly it also needs to be configurable to match the different DUT's that may be tested. Finally, the examples set out here show the need for four Tag RAM's (one for each DUT) that are addressable by Y (however many bits that needs), and are eight bits wide. If conventional Tag RAM's for X and Z were also desired, then there would need to be twelve such Tag RAM's. Conventional Tag RAM's have been stand-alone separate memories included in the tester.

As such, they are dedicated to, and configured ahead of time for, particular tasks and are not easily adapted for use in differing circumstances, if indeed they can be adapted at all.

Buffer Memory is another kind of interior test memory usage often found in a memory tester. It can be used to store an image of either stimuli or responses that can be found or given ahead of time. An example is the content of a ROM (Read Only Memory). Buffer Memory can be used either in place of or in conjunction with algorithmically generated test patterns.

In a conventional memory tester these different kinds of interior test memory usage have been realized by including separate memory mechanisms in the tester, each dedicated to its own particular purpose. This is both aggravating and wasteful, since it will often be the case that unused memory will be present but will not be available for a different desired function. Furthermore, such conventional ECR's, Tag RAM's and buffer memories have heretofore been realized with SRAM which, while fast and easy to control, is relatively expensive. SRAM is accessed using a single unified address, and it is faster than DRAM when arbitrarily addressed, but is also considerably more expensive. It would be desirable if by using DRAM the sizes of the ECR, Tag RAM and buffer memories could be both increased and their costs reduced, which benefits could be realized if there were a way to operate DRAM's with arbitrary not addressing at the same rate as commonly expected of the more expensive SRAM's.

How to replace SRAM with DRAM in the interior test memory of a memory tester was briefly described above, and is the subject of considerable material below. The technique described herein emphasizes an ECR as a principle example, but is by no means limited to DRAM used as an ECR. It will become abundantly clear that the DRAM Memory Sets can also be used to provide high speed, low cost, reconfigurable interior test memory that can be used to provide Tag RAM's and buffer memories. That done, it would be desirable if arbitrarily many different instances of all these different uses of interior test memory within a memory tester could be allocated and reconfigured as needed from a central collection of memory, rather than existing as separate pre-configured memory mechanisms.

Furthermore, having such a fair-sized pile of low-cost, fast and re-configurable interior test memory at our disposal raises the question of what else we might do to improve memory tester operation. In particular, it would be desirable if there were a way of reducing the effort needed to write and execute a test program. For example, could we reduce the specificity and complexity that attaches to a test program that needs to both generate stimuli and their expected responses for a device to be tested? We are, after all, testing memories, and we now have at our disposal a fair amount of interior test memory. Just as the notions of address and data classification driving Tag RAM's removes an analysis burden from the test program, perhaps there is an additional way to simplify some of the various memory test programs if sufficient interior tester memory is available.

What to do?

SUMMARY OF THE INVENTION

The various functions that are desirable for interior test memory are implemented in Memory Sets that can serve as the host for one or more of such functions. For example, it may be the case that, because of its size and the desirability of dedicated high speed data paths, an ECR might require an entire Memory Set of its own. However, an entire collection of Tag RAM's can be located in another Memory Set, along with buffer memories, should there be room and an absence of competition for memory cycles (a performance issue). If needed, buffer memories could be located in still a different Memory set. Generally speaking, things that need to be accessed simultaneously will be located in different Memory Sets. A Memory Set can contain many different items if they are created and used at times that are disjoint.

A collection of Tag RAM's might not need the entire width of the native word implemented by the Memory Set, and yet might exhibit the same range of addresses. Tag RAM's can be located side-by-side at the same addresses by taking advantage of the narrow word feature. The same economy can be achieved for buffer memories.

Even though these different uses of interior test memory within a Memory Set are actually located at arbitrary locations within the address space of that Memory Set, it is desirable that as far as the algorithmic processes within the test program are concerned, they appear to be addressed by addresses the same as, or derived-by-architecture from, addresses applied to the DUT. That is, several different tables within an address space are each organized as if they occupied the same segment of address space, but are in reality stored in separate regions so as to all fit and not overlap. But the test program wants to be free of the ugly details of where things actually are at the moment of execution. This may be arranged by augmenting the address classification mechanisms for the different Memory Sets to provide, under the control of the test program, automatic and dynamic variation of the address classification process as corresponding parts of testing are performed, so as to steer Tag RAM (or ECR or Buffer Memory) results into the correct location in the Memory Set of interest. This variation is on a test by test basis (i.e., pattern by pattern, or what is the same thing, segment by segment of the test program).

Finally, for certain classes of testing (more about that below), a portion of interior test memory can be used as a Stimulus Log RAM that operates as an ideal DUT to create (as if by emulation, but equivalent substitution is the actual mechanism) the correct conditions that are to exist in an actual DUT at the conclusion of all, or after some intermediate amount of, testing. The idea is to first get the test program's stream of transmit vectors to occur. This stream is then either: (A) Applied to the Stimulus Log RAM (alone) as if it were being exercised in place of the actual DUT (the Stimulus Log RAM does exactly what an actual good DUT would be expected to do); or, (B) Both (A) happens and the stream of transmit vectors is indeed applied to the actual DUT at the same time. In the case of (A), then when (A) is complete an actual DUT will be tested by again generating and sending that same sequence of transmit vectors to the actual DUT. In any event, after either (A) or (B) the Stimulus Log RAM and the DUT ought to have identical contents. Now the actual part can be read to discover its content, while the expected receive vectors are taken from the Stimulus Log RAM, and the comparison results sent to an ECR, Tag RAM's, etc., as usual. In this way the test program does not have to create or contain within itself the particular receive vectors that are the expected response from the applied stimulus. For those classes of test that are compatible with this approach (of which there are many), the test program is made simpler and easier to write and maintain, as fewer internal variables have to scale with, say, the size of the DUT's address space.

The kinds of test programs that can benefit from this technique are those that do, or that can be rearranged to, perform a series of writes without intervening comparison reads, followed afterwards by a series of comparison reads (with receive vectors) directed to the addresses that were earlier written to. Ordinarily in the prior art, stimulus segment #1 has associated with it a check segment #1, either merged in with the stimulus or performed separately, afterward. Either way, check segment #1 is specific to stimulus segment #1, since it has to contain the particular receive vectors required to pass the test. Now suppose that stimulus segment #2 is next, followed by (or including) check segment #2. It also is specific to the nature of stimulus segment #2. Now consider a universal check segment that merely compares the content of the DUT to that in the Stimulus Log RAM. Such a universal check segment can be used as check segments #1 and #2. This represents a considerable simplification in the writing and maintenance of test programs.

In a memory tester constructed in accordance with the preferred embodiment to be described, the mechanism that accepts transmit vectors to be sent to the DUT can be told to also (or perhaps instead) send them to a portion of interior test memory behaving as if it were an ECR, but that is actually the Stimulus Log RAM (in disguise, as it were). These transmit vectors are sent via the same path that would be used for the results of a comparison between transmit and receive vectors (which they are not, but that path does not know the difference). The Stimulus Log RAM will then act as an ideal memory that executes the stimulus portion of the test without error. We might say that we use a pseudo ECR for this initial Stimulus Log RAM function: it is convenient and efficient, since the memory used needs to be fast and connected to the results of the comparison, anyway. Once all the initial stimulus is performed, the content of the Stimulus Log RAM (which is nothing more than an appropriate portion of a Memory Set that has been temporarily acting as if it were really an ECR) is subsequently treated as (a destination) Buffer Memory (a reconfiguration issue), which then continues the remaining function of the Stimulus Log RAM (sending expected receive vectors to the comparison mechanism). Now the algorithmic mechanism (or a source Buffer Memory) sends a set of transmit vectors to the real DUT to read it and provoke receive vectors, while another portion of (perhaps another) Memory Set functions this time as an actual ECR (along with any Tag RAM's, etc.). Note that it is not necessary to actually copy the contents from the ECR portion into the destination Buffer Memory portion (as if to "free up" the ECR and "load' the Stimulus Log RAM); it is sufficient to simply redefine what portions of which Memory Sets are performing these various functions. The actual physical memory that is to be used as the Stimulus Log RAM is first written to in the same way as would be done for an ECR, and then it is read from as if it were a Buffer Memory, while another part of a Memory Set "becomes" the ECR.

DESCRIPTION OF A PREFERRED EMBODIMENT

Figure 1:
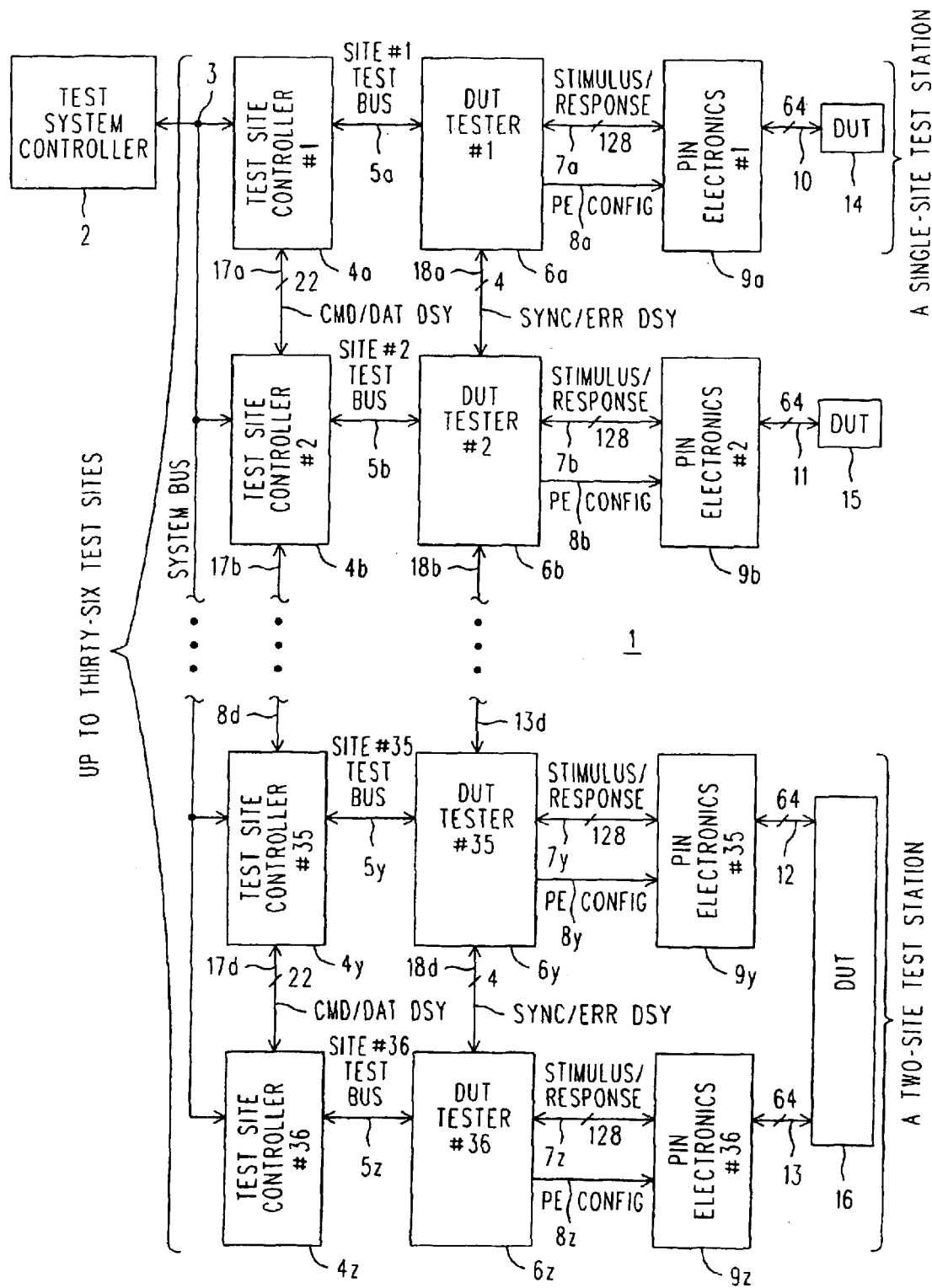
FIG. 1 is a simplified block diagram of an extensively reconfigurable non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) atone time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixtyfour channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

To briefly consider the opposite case, one should not assume that an entire Test Site is needed to test a single DUT, or that a single Test Site can test but a single DUT. Suppose that a wafer had two (probably, but not necessarily, adjacent) dies, the sum of whose test channel requirements were sixty-four channels or less. Both DUT's can be tested by a single Test Site. What makes this possible is the general purpose programmability of each Test Site. A test program executed by the Test Site may be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. The only difference is individually keeping track of whether the two "component DUTs" pass or fail, as opposed to a unified answer for the "third" DUT (that is, there is an issue concerning what portion of the "third" DUT failed). This "Single-Site Multi-Test Station" capability is largely conventional, and we mention it here for the sake of completeness, and to ward off potential confusion and misunderstanding when comparing it to the notion of bonding two or more Test Sites together.

Were it not for this notion of reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were split to create more Test Stations (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest OS), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse-widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (Oust as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7*a* passes between the DUT Tester 6*a* and a Pin Electronics #1 assembly 9*a*. The Pin Electronics assembly 9*a* supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes on the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9*a*. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8*a*.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master slave relationships between various the Test Site Controllers. We shall denote these daisy chained style communication arrangements with the suffix noun "DSY", instead of "BUS". Thus, we might refer to a Command /Data DSY instead of a Command/Data Bus. Now, the notion that information "enters B and is selectively passed on" may suggest that traffic is replicated onto a separate set of conductors before being passed on. It could be that way, but for up performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4*a*–4*z* that can populate the four card cages, each with nine Test Site Controllers. Let's denote them as 4*a*–4*f*, 4*g*–4*m*, 4*n*–4*t* and 4*u*–4*z*. (Never minding, as explained earlier, that these are nominally only twenty-six subscripts—the reader is invited to imagine that there are another ten subscript symbols in there, someplace.) A CMD/DAT DSY 17*a* (Command & Data Daisy Chain) interconnects the Test Site Controller 4*a*–4*f* that are in one card cage, while a different CMD/DAT DSY 17*b* interconnects the Test Site Controllers 4*g*–4*m* in another card cage. The same arrangement exists for the remaining card cages, and Test Site Controllers 4*n*–4*t* and 4*u*–4*z*, respectively. We have earlier said that the DSY do not leave the card cages, in that "tail end" of a bus that actually forms the DSY docs not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17*a*–*d* that we have been discussing exist between the various Test Site Controllers 4*a*–4*z*. There is a similar arrangement for the SYNC/ERR DSY 18*a*–18*d* and the DUT Testers 6*a*–6*z*. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

Figure 2:
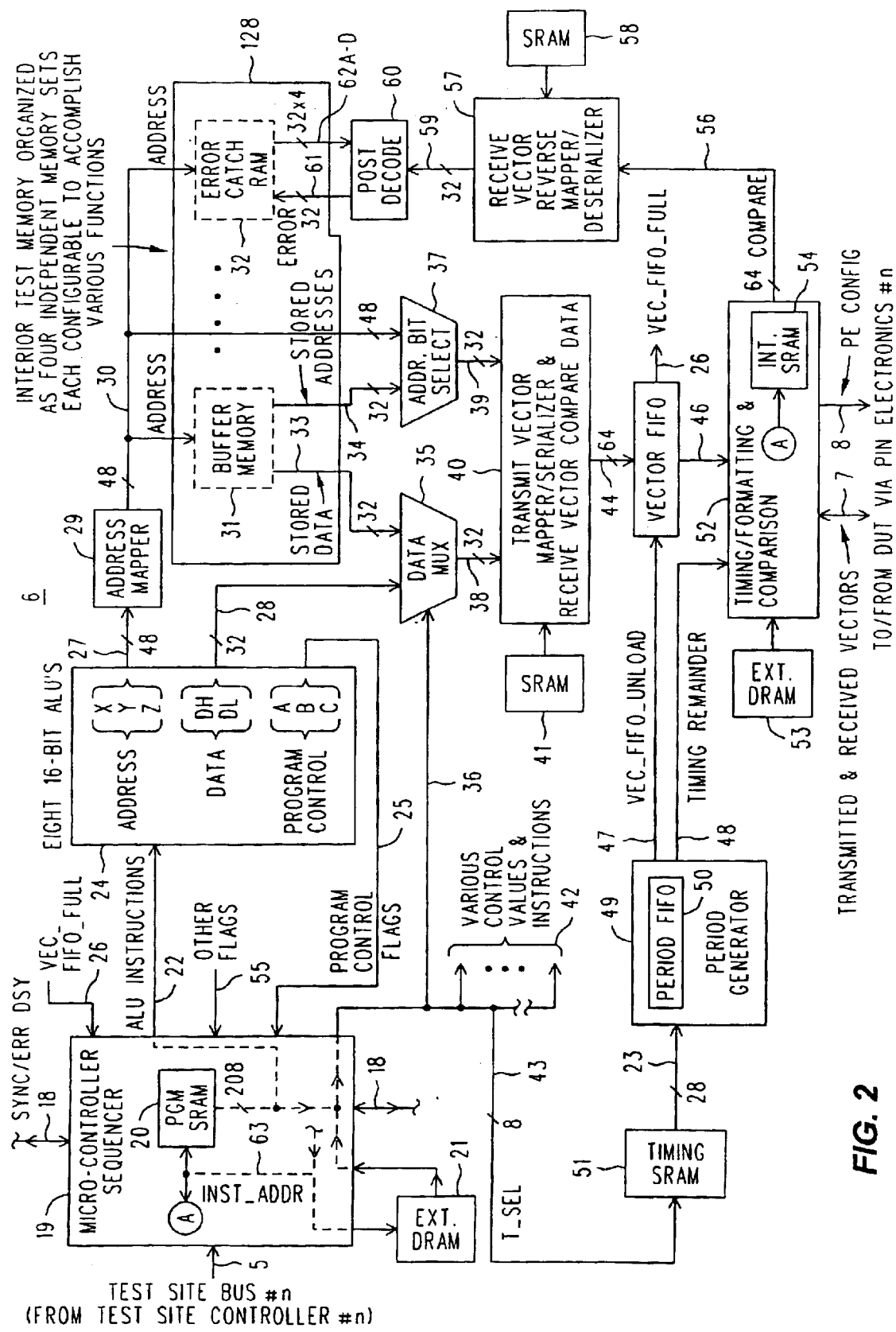
FIG. 2 is a simplified block diagram expansion of the DUT tester 6 of FIG. 1.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram.

Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and; despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Micro-Controller Sequencer 19, which may be likened to a special purpose microprocessor. It fetches instructions from a program stored in a program memory, which may be either internal to the Micro-Controller Sequencer 6 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is a large IC), so its size is limited. The external DRAM can be provided in adjustable amounts of considerable quantity, but is fast only when accessed in sequential chunks involving linear execution and no branching. Programming in the SRAM 20 most often is that which is intensely algorithmic, while the EXT. DRAM 21 is best suited for material not readily generated by algorithmic processes, such as initialization routines and random or irregular data.

The instruction word executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to be supplied to the DUT. Two more of the eight ALU/registers (DH & DL) are provided to assist in the algorithmic creation of (thirty-two)-bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address in ways familiar to those who understand about microprocessors. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a Group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for bottom) mirror image of another section of circuitry. This has the effect of rearranging what the bits mean, as far as what sequential address values are in physical order within that circuitry. This chip layout property may occur many times, and it may well be the case that how one Group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to a Buffer Memory 31 and to an Error Catch RAM 32, which, while having separate functions, may nevertheless be implemented as selectable partitions in the four Memory Sets that are collectively the Interior Test Memory 128. The mapped address output 30 is also applied as one input to an Addr. Bit Select circuit 37, which is described below. The Interior Test Memory can be configured to contain many instances of various RAM's used for different functions. This is accomplished by declaring that certain portions of the different Memory Sets are to be used for the associated purposes. What is shown in FIG. 2 is one such arrangement; arrangements can be changed as testing proceeds, and this whole business of Memory Set usage should be considered to be very dynamic. None of the inhabitants of the Interior Test Memory (e.g., the error Catch RAM 32) are permanent hardware fixtures. What is permanent are the four Memory Sets. But which part of which Memory Set is an Error Catch RAM at any given time (if indeed there is even one defined) is dependent on whatever configuration has been established.

Consider the Buffer Memory 31. Its function is to retain data patterns 33 and addresses 34 that can be applied to the DUT. These are actual separate outputs from the Buffer Memory 31, although the Buffer Memory 31 is not a dual "port memory", but is preferably composed of portions of two different Memory Sets. In keeping with this, it is preferred that Stored Data 33 is kept in one Memory Set, while Stored Addresses 34 are kept in another. Also, we have not shown an explicit mechanism for writing to the Buffer Memory 31. One way that may be accomplished is by an addressed bus operation initiated by a Test Site Controller 4 at the behest of the program it is executing. (There is an "under the floorboards," as it were, "utility services" bus called the "Ring Bus" [not shown—as it would clutter the drawing immensely] that goes to just about everything in FIG. 2.) Another and faster way of writing information to the Memory Sets is described in connection with FIG. 3.

The Error Catch RAM 32 is addressed by the same address that is applied to the Buffer Memory 31, and it either stores or retrieves information about errors, which operations are performed in conjunction with a Post Decode Circuit, to be discussed later. As with the paths 33 and 34 from the Buffer Memory 31, paths 61 (into the Error Catch RAM) and 62 (from the Error Catch RAM) are preferably MUX'ed outputs from a portion of a Memory Set (declared to be the current Error. Catch RAM 32), in accordance with configuration information distributed by the Ring Bus (not shown).

Note that the Data MUX 35 has as inputs the STORED DATA output 33 from the Buffer Memory 31 as well as data 28 from the registers DH and DL in the collection 24 of ALU's. The Data MUX 35 selects which of these inputs (28, 32) to present as its output 38, which is then applied as one of two vector components to a Transmit Vector Mapper/Serializer/Receive Vector Compare Data Circuit 40 (the other component is the output 39 of the Addr. Bit Select circuit 37). Data MUX 35 performs this selection in accordance with values 36 stored in PGM SRAM 20.

Circuit 40 can perform three functions: assemble vector components (38, 39) into an ordered logical representation an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) that will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19. The output of Circuit 40 is an up to sixty-four bit vector 44 that is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance of Pin Electronics 9 receives Transmitted & Received Vectors 7 and Pin Electronics configuration information 8 from its associated Timing/Formatting & Comparison circuit 52.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54.) The Internal SRAM 54 (or external DRAM 53) assists in the production of Drive and Comparison cycles. Drive cycles apply a transmit vector to the DUT. Comparison cycles receive a vector presented by the DUT and examine it to determine if it matches previously supplied comparison data. Both Drive and Comparison cycles are adjustable as to their duration, whether and when a load is applied, and when data is latched or strobed. The comparison produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60. At present, it is sufficient to say that the Post Decode circuit 60 can inspect via programmatic criteria both incoming error information 59 and (previously) stored error information 60 (stored in Error Catch RAM) to produce condensed and more readily interpretable error information which may then by stored back into the Error Catch RAM 32 via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/ Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are (twenty-eight)-bit values stored in the Timing SRAM 51 and that are addressed by T_SEL. Each addressed (twenty-eight)-bit value (23) specifies a desired duration with a 19.5 picosecond resolution. The sequence of accessed (twenty-eight)-bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

Figure 3:
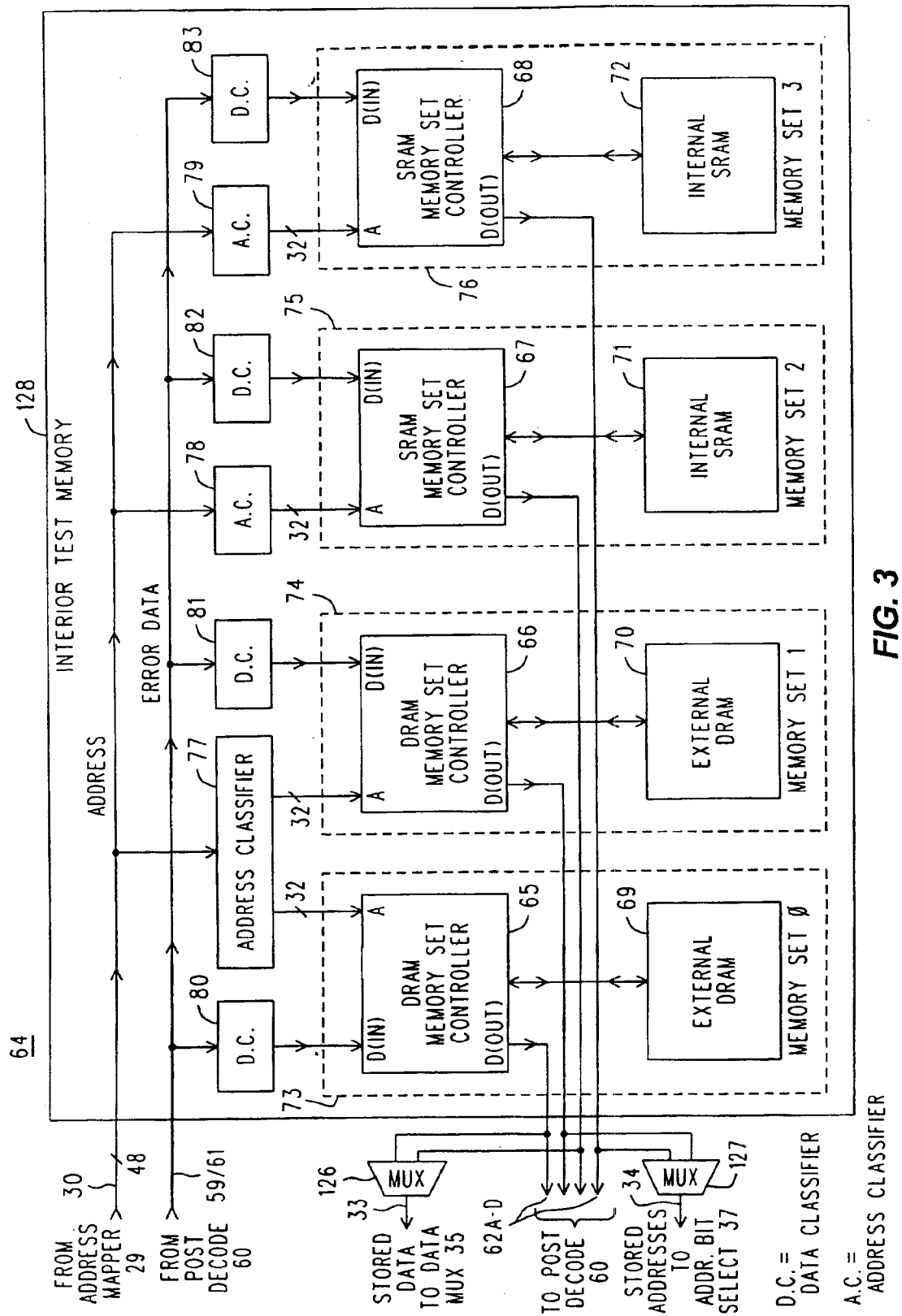
FIG. 3 is a simplified functional block diagram of the interior test memory mechanism that appears in the block diagram of FIG. 2.

Refer now to FIG. 3, which is a simplified block diagram 64 of the Interior Test Memory 128 in the block diagram of FIG. 2. It receives a (forty-eight)-bit mapped address 30 from the Address Mapper 29, which is applied to various Address Classifiers 77, 78 and 79. The Address Classifiers are associated with Memory Sets 73–76, which are each complete memory mechanisms that can individually perform various functions, such as being an ECR 32. Two of these Memory Sets (73, 74) are of external DRAM, while two are of internal SRAM. The two external DRAM Memory Sets will always have the same Address Classifier function in effect, and thus share one common Address Classifier 77. The internal SRAM Memory Sets 75 and 76 each have their own associated Address Classifiers, 78 and 79, respectively. These Address Classifiers can either pass an address through unchanged, or modify it in ways to be described in some detail in due course below.

Each Memory Set includes a Memory Set Controller; the external DRAM Memory Sets 73 and 74 have DRAM Memory Set Controllers 65 and 66, respectively, while the internal SRAM Memory Sets 75 and 76 have respective SRAM Memory Set Controllers 67 and 68. During the testing of a DUT the address for memory transactions directed to any of these Memory Sets arrives at the associated Memory Set Controller from the respectively associated Address Classifier. During the testing of a DUT Error Data 61 arriving from the Post Decode circuit 60 and that is to be written into an ECR is first applied to Data Classifiers 80–83, one of which is associated with each Memory Set. The function of the Data Classifiers will be described in due course below. They may or may not change the data applied to them, depending upon how they are configured and the function they are to perform. The Address and Data Classifiers represent high speed paths for addresses and data, respectively, which are intended to operate at the highest speeds necessary. We shall shortly see that the Ring Bus (not yet shown) provides another way to convey addresses and data to the Memory Sets.

At this point we have four Memory Set Controllers (65–68) that each have incoming (classified) addresses and (classified) data. Each of these Memory Set Controllers is coupled to an associated memory: DRAM Memory Set Controllers 73 and 74 are respectively coupled to external DRAM's 69 and 70, while SRAM Memory Set Controllers 75 and 76 are respectively coupled to internal SRAM's 71 and 72. These arrangements constitute the four Memory Sets 73–76, two of which (75, 76) have modest amounts of high speed SRAM, and two of which (73, 74) have large amounts of slower DRAM. What is of interest to us at present is how the DRAM Memory Sets can be made as fast as the SRAM Memory Sets, as well as how to incorporate certain alternatives concerning configuration of the DRAM, depending upon user preference and test program strategy. Thus, it is going to turn out that the DRAM Memory Set Controllers 65 and 66 are configurable, perform different types of memory transactions, and are not altogether the same as the simpler SRAM Memory Set Controllers 67 and 68. For the sake of brevity, FIG. 3 does not show the structure that provides this flexibility; for now let's just say that each Memory Set Controller is connected to the Ring Bus (not yet shown), from which it is instructed in the particular mode of operation and configuration that are desired. Some of these modes involve how data is stored, and some have to do with getting it back out again. To conclude, then, note that each Memory Set does have an associated Data Out (62A–D) which is sent to the Post Decode Mechanism 60 for further processing. Note also that the data outputs from Memory Sets zero and two are applied to a MUX 126 whose output becomes STORED DATA 33 that is sent to Data MUX 35. Similarly, the data outputs from Memory Sets one and three are applied to a MUX 127 whose output becomes STORED ADDRESSES that are sent to the Addr. Bit Select MUX 37. The reason for having MUX's 126 and 127, and the details of how they are controlled will be discussed in due course below.

Figure 4:
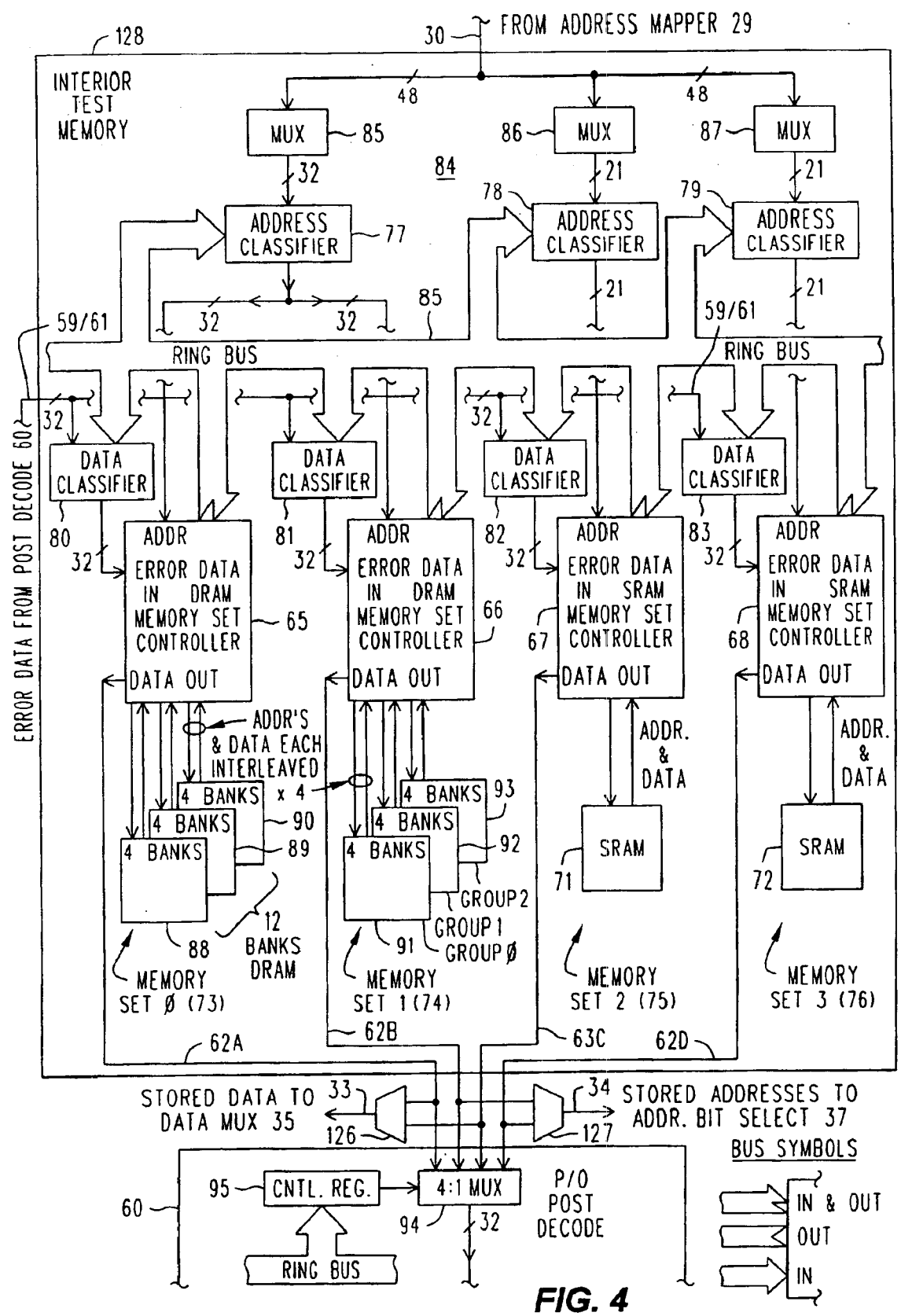
FIG. 4 is a more detailed block diagram of the interior test memory mechanism of FIG. 3.

Now consider FIG. 4, which is a more detailed block diagram 84 of the Interior Test Memory 128 that was described in conjunction with FIG. 3. It is much the same, and similar elements have been designated with common reference numerals. For our present purposes it is sufficient to point out the incremental differences present in FIG. 4. Specifically, note that each of the Address Classifiers (78–79) is preceded by an associated MUX (85–87). These MUX'es assist in the process of address refinement, and especially in getting the size of the address down from forty-eight bits to thirty-two. Furthermore, it will be noted that the Ring Bus 85 is coupled to each of the Memory Set Controllers (65–68). Note that the Data Out's (62A–D) from Memory Set Controllers are, once they get to the Post Decode circuit 60, applied to a 4:1 MUX 94 that, according to a Control Register 95 set by the Ring Bus, determines which output is selected for further processing.

Our main interest in FIG. 4 has to do with the overall organization of the memory controlled by the various Memory Set Controllers 65–68. In the case of Memory Set Two (75) and Memory Set Three (76) that memory is simply SRAM disposed as a single (within its Memory Set) address space, and that operates in a conventional manner. However, in the case of Memory Set Zero (73) and Memory Set One (74) the memory for each is three Groups of four Banks each, and the format for an address depends upon the mode and configuration information currently applicable to those Memory Sets.

So, for example, Memory Set Zero (73) has three Groups 88, 89 and 90, while Memory Set One (74) has Groups 91, 92 and 93. In one high speed mode for random addressing consecutive memory transactions are automatically sent to different Groups (multiplexing), each of which has its own hardware path for address and data. Each of these Groups is made up of four Banks (four instances of an address space), for which the memory operations can be interleaved in accordance with principles and practices understood in the art. Specifically, the type of DRAM preferred for use at present is SDRAM, which implies a particular strategy for interleaving. It will be appreciated that there are other types of DRAM and that other mechanisms for interleaving are possible, besides the one to be described below. In another mode for slower random addressing the Groups are addressable instead of being selected automatically. In this slower mode extra address bits for the Group are used to select the hardware path. In this mode an address specifies a Group and a Bank address within that Group of interleaved Banks. In yet another high speed mode with well behaved addressing, both multiplexing and interleaving are turned off, and an address has Group selection bits, Bank selection bits and within-Bank address bits. In a narrow word mode of operation still additional addressing bits are used to specify a field within the entire word that is the target of the memory transaction.

Figure 5:
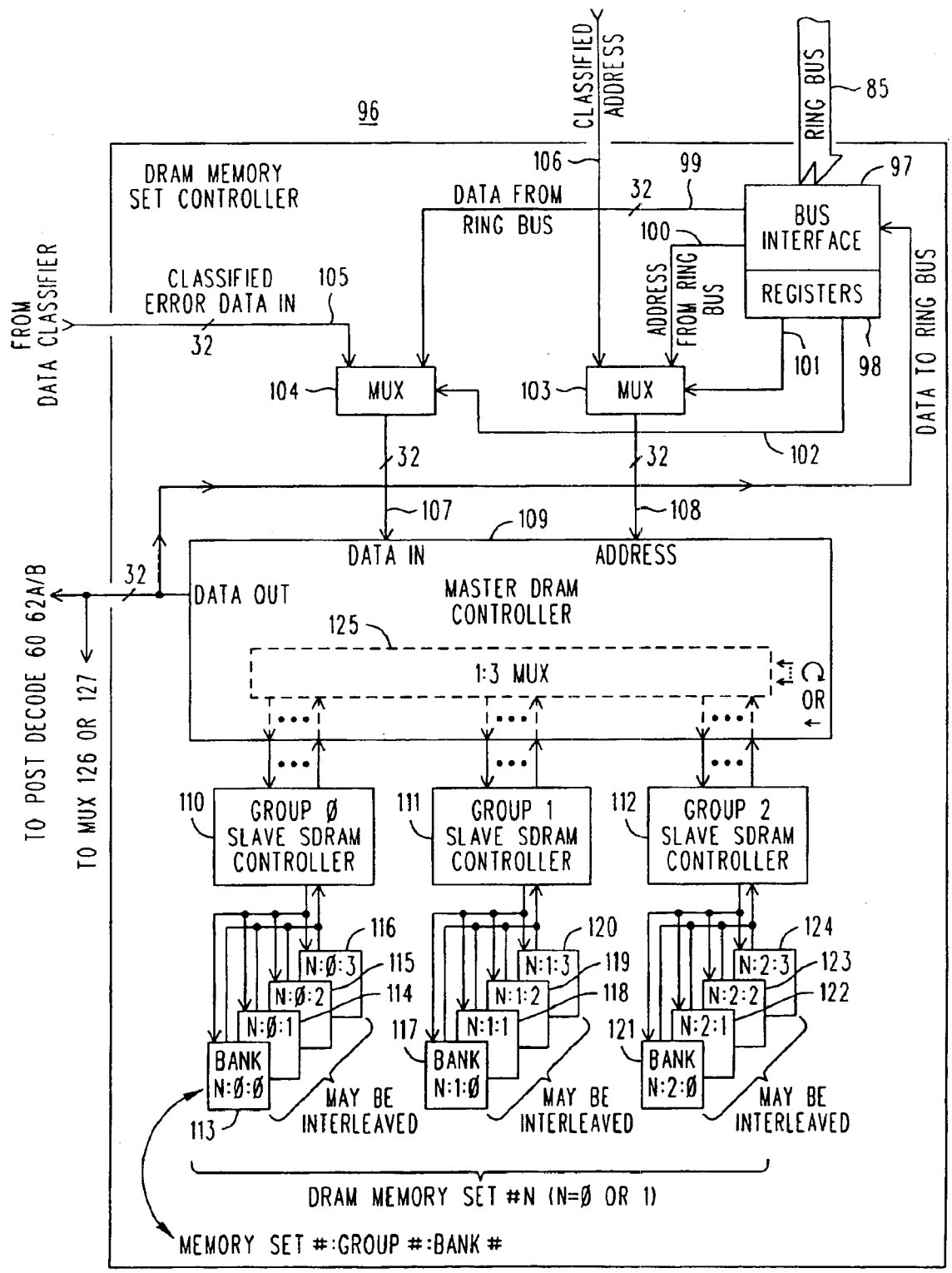
FIG. 5 is a simplified block diagram of a DRAM Memory Set Controller mechanism that appears in the block diagrams of FIGS. 3 and 4.

Turn now to FIG. 5, which is a simplified block diagram 96 of a DRAM Memory Set Controller (65, 66) appearing in FIGS. 3 and 4. It receives as input a CLASSIFIED ADDRESS 106, mode and configuration information from the Ring Bus 85, and ERROR DATA IN 105 from the associated Data Classifier. As before, it produces DATA OUT (62A/B).

However, it can now been seen that other sources of address and data may provide those quantities via the Ring Bus 85. That is, there is a Bus Interface 97 that couples the Ring Bus to the DRAM Memory Set Controller, and via that interface DATA FROM RING BUS 99 and ADDRESS FROM RING BUS 100 are available. A MUX 104 selects whether ERROR DATA IN 105 or DATA FROM RING BUS 99 is sent forward as data 107, thence to be applied to the DATA IN terminal of a Master DRAM Controller 109. Likewise, a MUX 103 selects between CLASSIFIED ADDRESS 106 and ADDRESS FROM RING BUS 100 to produce the address 108 that is applied to the ADDRESS terminal of the Master DRAM Controller. A collection of one or more registers 98 whose content is set by traffic on the Ring Bus produces control signals 101 and 102 that indicate the selections to be made by MUX'es 103 and 104, respectively.

It will further be appreciated that DATA OUT (62A/B) is additionally applied to the Bus Interface 97, thus allowing that DATA OUT to be sent over the Ring Bus.

A principal function of the DRAM Memory Set Controller is the allocation or distribution of the various memory transactions among the three Groups. In a high speed mode of operation it performs this allocation in a round robin fashion using (the equivalent of) a 1:3 MUX 125. The MUX 125 is shown as a dotted line, since it will be clear that, while there could indeed be a MUX, in the present preferred embodiment, there is not an actual MUX at that location. Instead, there are multiple instances of addressable data sources under the control of a sophisticated rule following mechanism (a state machine).

To complete our discussion of FIG. 5, note that the 1:3 MUX 125 drives three Slave SDRAM Controllers (110–112), there being one such Slave SDRAM Controller for each of Group 0, Group 1 and Group 2. Each SDRAM Slave Controller has as its Group a collection of four Banks of SDRAM. For example, the SDRAM Controller 110 for Group 0 is coupled to Banks 113, 114, 115 and 116. In similar fashion Group 1 has Banks 117–120, while Group 2 has Banks 121–124. The result is a total of twelve Banks for each DRAM Memory Set, of which there are two.

The SDRAM of each Group can be arranged to operate in several modes or configurations. When configured for random addressing operation at the highest speed, multiplexing between Groups happens at the highest rate, and consecutive memory operations are always and automatically sent to the next Group in a cyclic sequence thereof. Within a Group, memory operations are interleaved to evenly distribute them among the four Banks. A regular cyclic sequence is preferred here, too. The interleaving produces a four-fold increase in speed, which, when combined with a three fold increase provided by the multiplexing, is an increase in speed by a factor of twelve. This manner of operation treats each Bank as a full address space, with no attempt to control ahead of time which of the twelve Banks is the target for a particular memory transaction. That is, data to be stored might end up in any one of the twelve Banks, and a simple read from the memory might retrieve contents from any one of the twelve Banks. There is no reason to expect that the content of an address at one Bank is the same as the content of that same address in another Bank. At this point is clear, however, that data can be stored at a rate at least ten times that of the rate for a single Bank of DRAM. The price we pay is, of course, that in order to read data out at an address we need to investigate the content of that address at all twelve Banks (for R100 operation) or all three Banks (for R33 operation).

At this point we can set out some of the terminology and brief descriptions for some of the various modes and configurations that the DRAM Memory Sets can support. Here they are:

Random 100 MHZ (R100)
 Full speed write operation using three multiplexed Groups of four interleaved Banks each to permit randomly addressed writes to an address space equal in depth to one Bank. Both multiplexing and interleaving are in use. Data will be written to the 'next' Bank in the 'next' Group, and an incoming address has no bits to identify a particular Group or particular Bank.

Random 33 MHZ (R33)

Reduced speed write operation using an addressed Group of four interleaved Banks to permit randomly addressed writes to an address space equal in depth to three Groups, which is equivalent to an address space three Banks deep. Interleaving is in use but not multiplexing. Data will be written to the 'next' Bank in the addressed Group, and an address has Group selection bits but no Bank selection bits. Group selection bits are most significant address bits, so except at Group boundaries, consecutive addresses are to consecutive within-Bank locations, but at a Bank determined by the automatic interleaving.

Localized 100 MHZ (L100)

Full speed operation using an addressed Bank within an addressed Group to permit both reads and writes having minimal ROW address changes to an address space equal in depth to twelve Banks. An incoming address has Group selection bits, Bank selection bits and address bits specifying a within-Bank location. No multiplexing, no interleaving, and within-Bank addressing is to meet locality requirements. Lack of locality is automatically detected and needed readdressing is performed. Lack of locality is not fatal, but if consistently violated the result is doggy slow performance.

Stacked Memory Sets

In any of the above, Memory Sets 0 and 1 can be combined to present twice the depth of address space, as can Memory Sets 2 and 3, also. The incoming address has Memory Set selection bits.

Narrow Words

In any of the above modes a Memory Set can be configured to have a word width that is a power of two and less than or equal to thirty-two. Such a narrow word is a field within the full word width of an addressed word, is located on power-of-two boundaries, and uses extra address bits to locate the field within the addressed word. Works with R100 and R33, but not with L100.

Composition

In the above "Random" access modes the need to read multiple Banks when preparing output data for a read is supported by a hardware assist that merges the results; at an address from the four Banks of the appropriate Group for R33 and from all twelve Banks for R100. By enclosing a compose operation in a loop that walks the within-Bank address while storing the results in all Banks or in a known Bank, an entire region of memory can be composed ahead of time to permit faster access during analysis of test results.

Composition Integrity

Detection of loss of composition to a composed region of memory has a hardware assist.

Hidden Refresh

The refresh operation of the DRAM's in the various Banks is automatically performed without interference with any of the above modes or configurations.

In concert with the above collection of capabilities, individual memory transactions can be described as belonging to one of the following categories:

Overwrite Write (OWW)

A strict replacement write to all (each of the) one, four or twelve Banks at one address; previous contents are lost. Works with R100 (12 Banks), R33 (4 Banks) and L100 (1 Bank), but does not preserve rated speed operation for Random addressing. Maintained for compatibility with test programs for older memory testers. Uses classified address and classified data.

Overlay Write (OLW)

A read-modify-write operation supporting "sticky zeros" to the 'next' of one, four or twelve Banks. A zero in a bit position will not be overwritten with a one, but a one can be overwritten with a zero. Works at rated speed with R100 (12 Bank), R33 (4 Banks) and L100 (1 Bank). This is the principal way to write data during testing, and allows the trapping of a failure in a bit position over repeated testing at a DUT address. Not to be confused with composition, since unless the data is written in L100 (an onerous requirement) it will still need to be composed. Uses classified address and classified data.

System Write (SYW)

Writes to a single Bank in L100. Writes the same thing to all four Banks of an addressed Group in R33 and to all twelve Banks in R100, but does not preserve rated speed. Source for the address and data is the Ring Bus.

System Read (SYR)

Reads from a single Bank in L100. Performs at the address a composed read from all four Banks of an addressed Group in R33 and from all twelve Banks in R100, but does not preserve rated speed. Address source and data destination is the Ring Bus.

Analysis Read (ANR)

Performs at the address a composed read from all four Banks in of an addressed Group R33 and from all twelve Banks in R100, but does not preserve rated speed. Uses the classified address and sends the data to Post Decode via paths 62A–D.

Buffer Memory Read (BMR)

Full speed (100 MHZ) read at a random address for whichever Bank is 'next.' Works with L100 (same Bank is always 'next'), R33 ('next' of four Banks in the addressed Group), and R100 ('next' of four Banks in the 'next' of three Groups). Uses the classified address and sends the data to Post Decode via paths 62A–D.

Clearly, some of the above arise from the multiplexing and interleaving scheme. The multiplexing and interleaving schemes are, of course, limited to the DRAM Memory Sets (the SRAM Memory Sets go fast to begin with). This does not mean, however, that these same abilities or modes of operation cannot be supported by the SRAM Memory Sets. In general, memory transactions that can be directed to one Memory Set can be directed to any other, subject only to size constraints. An SRAM Memory Set will honor any style of operation that a DRAM Memory Set would. The difference is how the Memory Set controller internally implements the desired transaction. For example, in the case of an Analysis Read (compose) an SRAM Memory Set need not bother beyond doing the simple read, since its data is already composed in the first place.

These various styles of memory transaction may be combined as needed within a test program. For example, after testing a loop can compose all data within a range of addresses for a particular Memory Set. Then BMR's can be used (at high speed) to get at the data in any random order. This works because at every address (in the composed range) each Bank has the same data.

Figure 6:
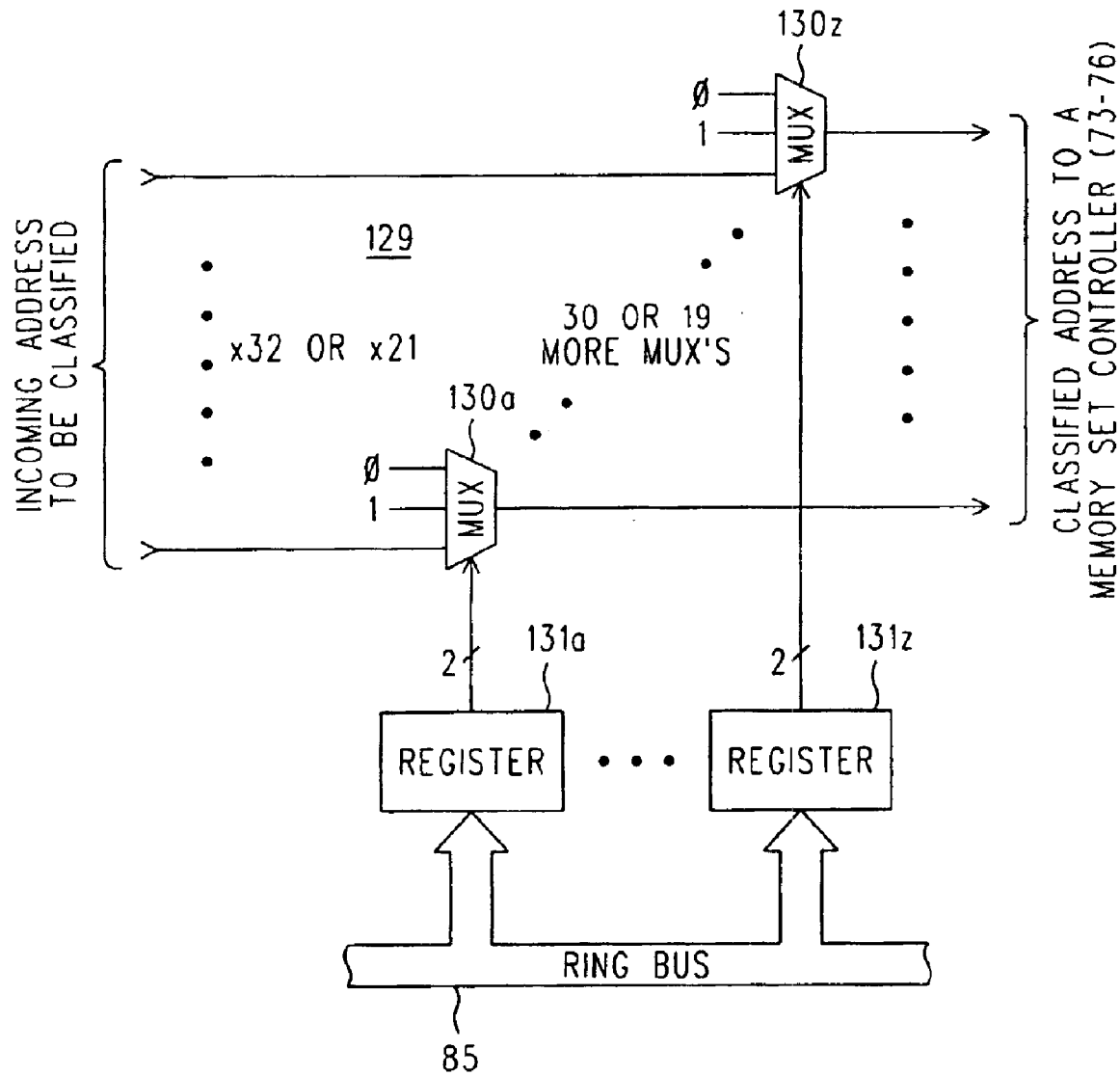
FIG. 6 is a simplified block diagram of an Address Classifier circuit used in FIGS. 3 and 4.

To resume our discussion, refer now to FIG. 6, which is a simplified block diagram 129 of the Address Classifiers (77, 78, 79) shown in FIGS. 3 and 4. It will be recalled that it is desirable that a plurality of tables located within a Memory Set (such as Tag RAM's, Buffer Memories, etc.) are all addressed by the same range of applied DUT addresses, but that these tables do not overlap. This means that the tables have got to have separate ranges of addresses, even though the sequence of addressed locations therein correspond to each other. One function of an Address Classifier is to shift an address range by some amount so that the existence of the range is preserved, but that its location is changed by the amount of the shift. For performance reasons we do not actually add some arbitrary value to the address with an adder: that would be slow and consume high amounts of space on the die of the VLSI circuit of which the Address Classifier is a part. Instead, we force the upper address bits (for an address to be moved) to have different values. Say, for example, that the range of interest is described by ten least significant bits. Then that range can be relocated by forcing any of the more significant (and otherwise unused) bits to some different value.

In FIG. 6 this is accomplished by a collection of MUX's 130a–z (either thirty-two or twenty-one in number, for Address Classifiers 77 or 78/79, respectively), one for each address bit. Each MUX in this collection 130 receives a constant logic zero, a constant logic 1 and the corresponding actual bit of the address to be classified. The function of each MUX is to select which bit positions in the classified address are forced to ones or zeros, and which are allowed to be driven by their true value. To facilitate this, each MUX in the collection 130 receives a two-bit control input originating at a respective latch 131a–z in a collection of such latches. These latches are set by commands sent via the Ring Bus 85.

Address Classification also cooperates with the upstream MUX's 85–87 of FIG. 4, in that those MUX's determine which of the (forty-eight)-bit address bits 30 from the Address Mapper 29 are passed on as a (thirty-two)-bit address, and what bit position those passed on bits occupy.

Figure 7:
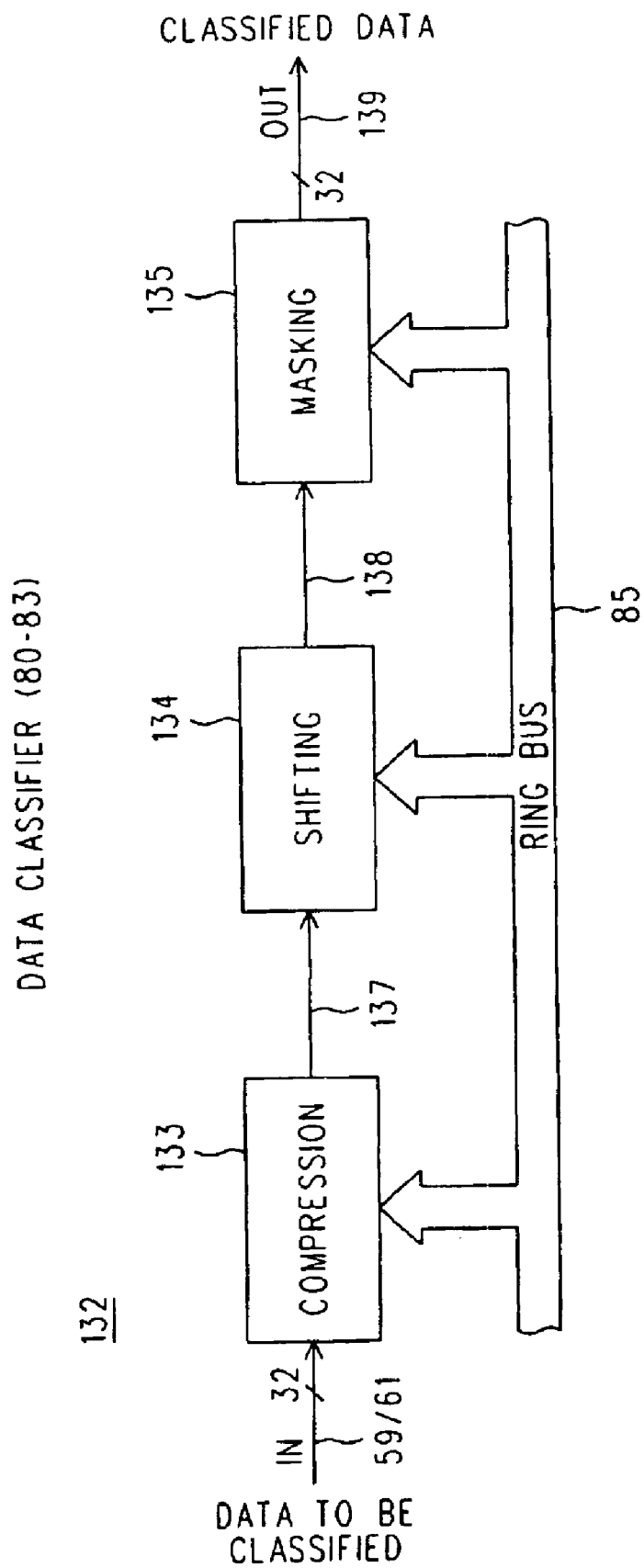
FIG. 7 is a simplified block diagram of a Data Classifier circuit used in FIGS. 3 and 4.

It will also be recalled that there were several conditions requiring Data Classification. Among these was the desire to have any failure within a defined collection of channels be represented by one bit in the classified data. This was termed "compression" and is one of the functions of Data Classification. Another is "shifting" in support of the narrow word feature. This requires that the position within a data word of an entire field of data bits be relocated within the word. A final function needed as a component of Data Classification is "masking" to force selected data bits to predetermined values while selecting others to be represented by their unaltered value. FIG. 7 is an overall simplified block diagram 132 of the Data Classifiers (80–83) that perform these functions. It shows that data to be classified (59/61) before being stored in a Memory Set is sent to a compression circuit 133, then to a shifting circuit 134, and finally to a masking circuit 135. It also shows that each of these circuits 133–135 is controlled by the Ring Bus 85.

Figure 8:
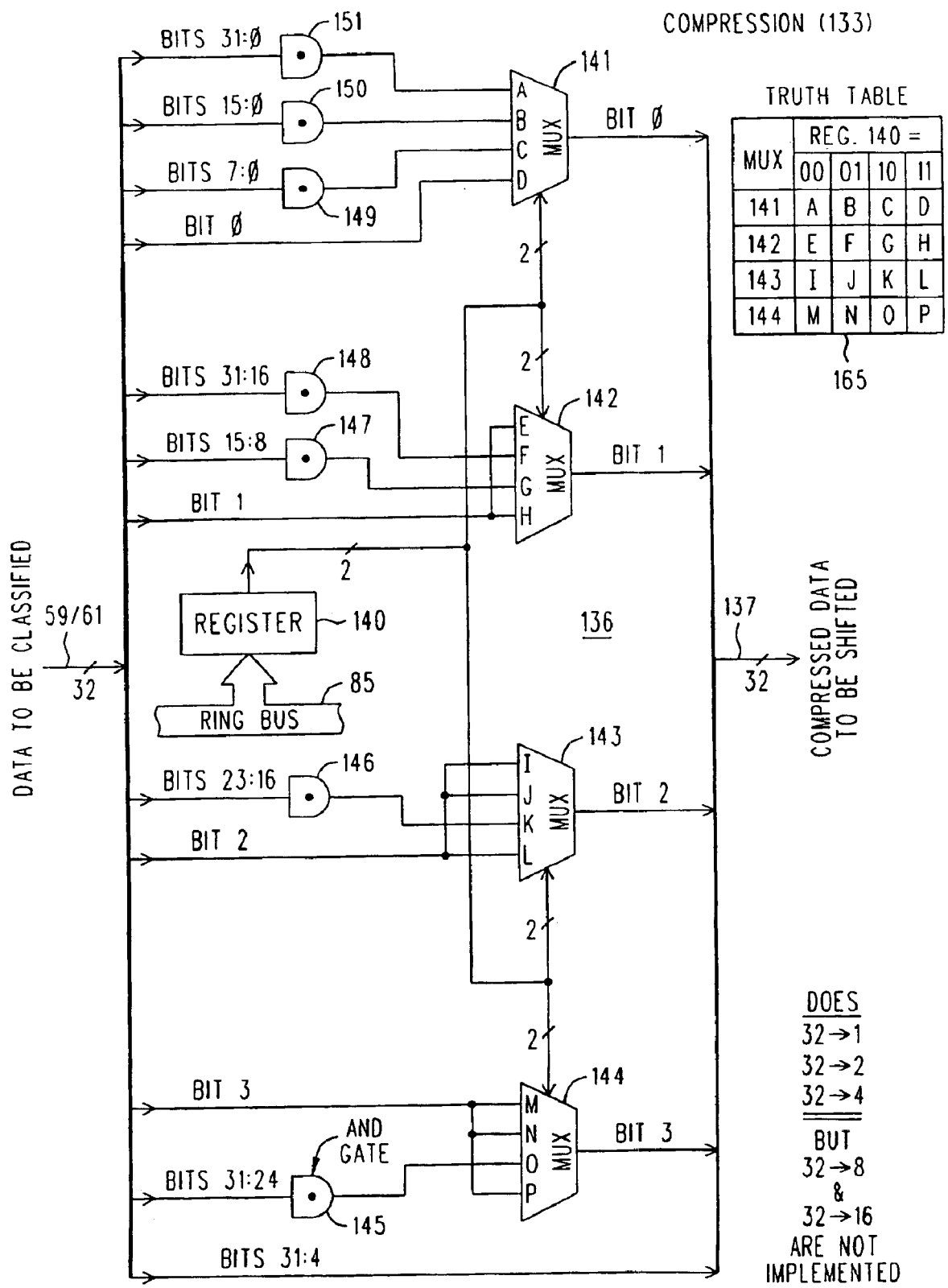
FIG. 8 is a simplified block diagram of a compression circuit used in FIG. 7.

FIG. 8 is a simplified block diagram 136 of the compression circuit 133. The circuit 133 includes four MUX's 141, 142,143 and 144, each of which is controlled by the content of a common register 140 that is set by the Ring bus 85. Each MUX is fed by a different low order data bit (BIT 0–BIT 3), as well as by the AND'ing of various adjacent bits in the input data 59/61. It will recalled that the purpose of compression is to make one bit in the data path represent any failure in a pre-specified collection of bits. The various AND'ings represent those pre-specified collections. Recall also that a zero represents a failure to compare, hence one represents successful comparison. What the various AND gates 145–151 do is detect the pre-defined collections of bits that have all within their respective collections compared successfully. The truth table 165 indicates what collections have their AND's passed to the output for different values in the control register 140. Note that the arrangement also passes bits 31:4 in any case, so as to be able to not do any compression when each of the MUX's is simply passing its associated low order bit. The final result is compressed data 137 that is sent to the shifting circuit of FIG. 9.

Figure 9:
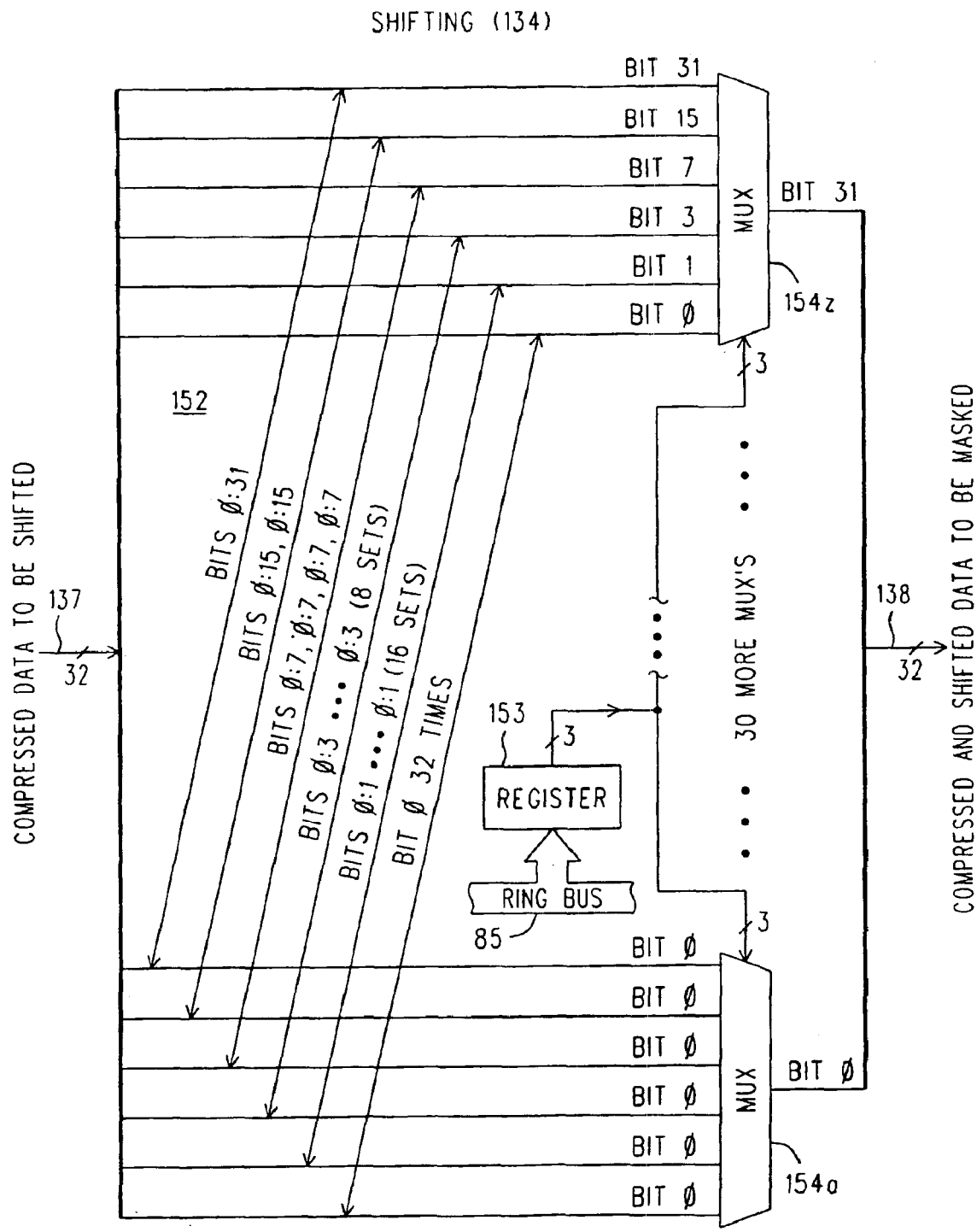
FIG. 9 is a simplified block diagram of a shifting circuit used in FIG. 7.

Refer now to the shifting circuit 152 of FIG. 9. It receives as input the compressed data 137 produced by the compression circuit of FIG. 8. Bluntly put, the circuit 152 is a MUX farm of thirty-two six-input MUX's 154a–154z. Each of these MUX's is connected to the various collections of compressed data that is shown in the figure. The MUX's 154a–z are all identical, and each picks one of its six inputs according to the contents of a three-bit control register that is set by the Ring Bus 85. As can be seen by an inspection of the figure, the kind of shifting produced is the replication of collections of bit positions rather than a "bit left shift" or "bit right shift" by n-many bit positions that might be produced by, say, a barrel shifter. This replication form of shifting is sufficient to get a particular pre-defined field of bits into another location in the word, and what the other locations are is generally not of interest. The result is compressed and shifted data 138 that is to be masked by the masking circuit of FIG. 10.

Figure 10:
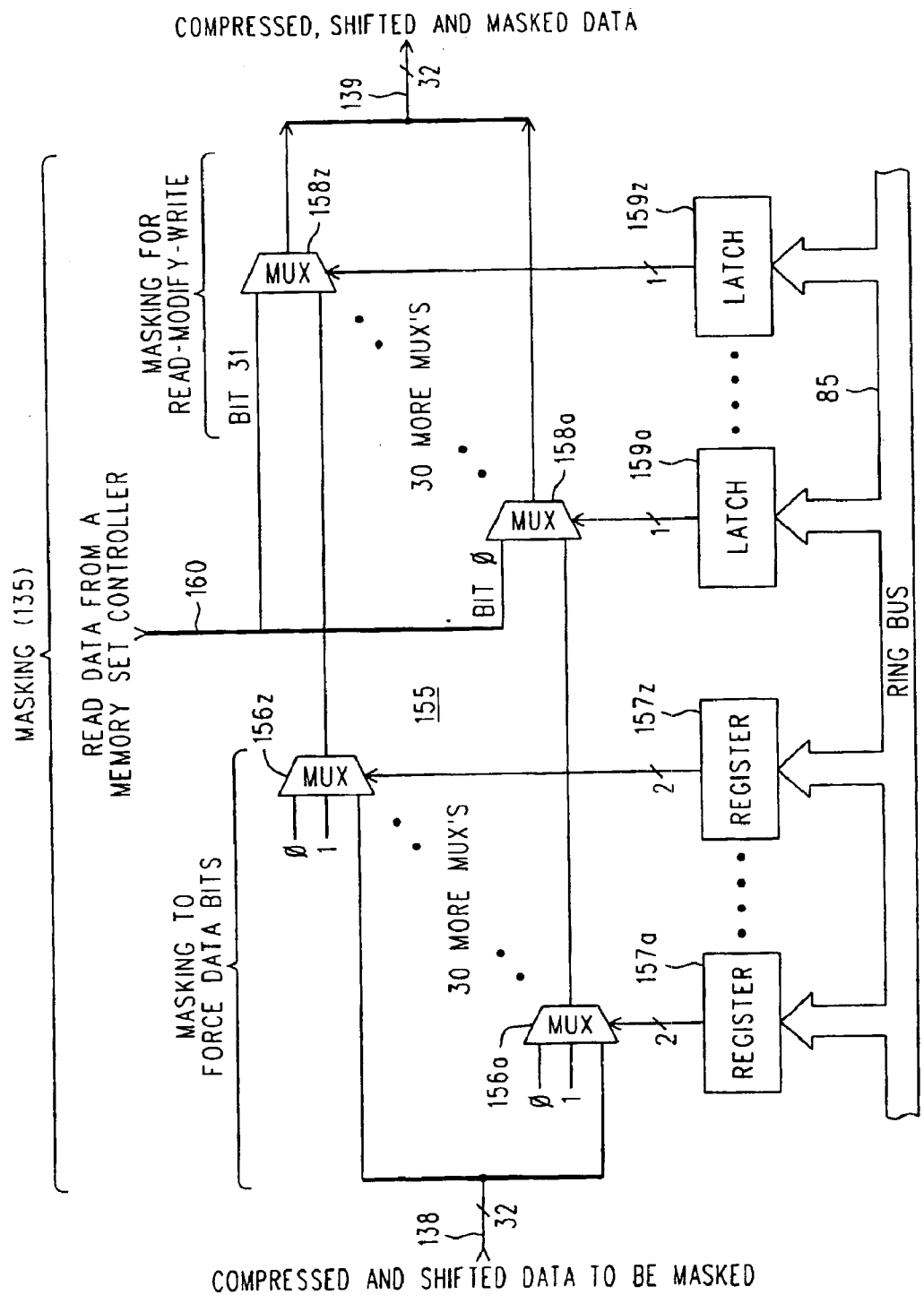
FIG. 10 is a simplified block diagram of a masking circuit used in FIG. 7.

The final step in the data classification process is shown in FIG. 10, which is a simplified block diagram 155 of two kinds of masking circuits. The first masking circuit is for forcing data bits in selected positions to have particular values. This portion of FIG. 10 includes thirty-two 3:1 MUX's 156a–z, controlled by respectively associated control registers 157a–z that are each setable by the Ring Bus 85. It operates in exactly the same manner as circuit 129 of FIG. 6, except that the bits being forced are data bits instead of address bits. The forcing of data bits, it will recalled, is useful when extraneous data bits are to be disregarded by simply declaring them to be "good," for example. The second masking function is not necessarily a part of the data classification function, but is logically located at this point in the data flow, and is itself another masking operation. Since it supports a feature of interest (a read-modify-write for narrow word operation) it has been included here for completeness. MUX's 158a–z choose between the masked data having forced bits and the data read from a location in the Interior Test Memory that is to be modified in part and in part re-written without modification. The selections as to which bits are which is performed by the MUX's 158a–z on a bit-by-bit basis, in accordance with the respective contents of the control latches 159a–z, which get set according to traffic on the Ring bus 85. If a MUX 158 selects a bit from the forced data bits (MUX's 156) then that bit is being modified. If, on the other hand, that bit is coupled to what was read from memory and supplied by the Memory Set Controller, then it is being re-written without modification. In any event, the result is compressed, shifted and masked data 139 that is the output from the data classification process of FIG. 7.

It will be recalled that for certain classes of testing a Stimulus Log RAM operates as an ideal DUT to create the correct conditions that are to exist in an actual DUT at the conclusion of all, or after some intermediate amount of, testing. The idea is to get the test program's stream of transmit vectors applied to the Stimulus Log RAM as if it were being exercised in place of the actual DUT (the Stimulus Log RAM does exactly what an actual good DUT would be expected to do). That stream of transmit vector may be applied to the actual DUT at the same time. In any event, the Stimulus Log RAM and the DUT ought to have identical contents after both have responded to the same sequence of transmit vectors. Now the actual part can be read to discover its content, while the expected receive vectors (compare data) are taken from the Stimulus Log RAM, and the comparison results sent to an ECR, Tag RAM's, etc., as usual. In this way the test program does not have to create or contain within itself the particular receive vectors that are the expected response from the applied stimulus. For those classes of test that are compatible with this approach, the test program is made simpler and easier to write and maintain, as fewer internal variables have to scale with, say, the size of the DUT's address space.

In a memory tester constructed in accordance with the preferred embodiment to be described, the mechanism that accepts transmit vectors to be sent to the DUT can be told to also (or perhaps instead) send them to a portion of interior test memory behaving as if it were an ECR, but that is actually the Stimulus Log RAM. These transmit vectors are sent via the same path that would be used for the results of a comparison between transmit and receive vectors (which they are not, but that path does not know the difference). The Stimulus Log RAM will then act as an ideal memory that executes the stimulus portion of the test without error. We might say that we use a pseudo ECR for this initial Stimulus Log RAM function: it is convenient and efficient, since the memory used needs to be fast and connected to the results of the comparison, anyway. Once all the initial stimulus is performed, the content of the Stimulus Log RAM (which is nothing more than an appropriate portion of a Memory Set that has been temporarily acting as if it were really an ECR) is subsequently treated as (a destination) Buffer Memory (a reconfiguration issue), which then continues the remaining function of the Stimulus Log RAM (sending ifs expected receive vectors to the comparison mechanism). Now the algorithmic mechanism (or a source Buffer Memory) sends a set of transmit vectors to the real DUT to read it and provoke receive vectors, while another portion of (perhaps another) Memory Set functions this time as an actual ECR (along with any Tag RAM's, etc.). Note that it is not necessary to actually copy the contents from the ECR portion into the destination Buffer Memory portion (as if to "free up" the ECR and "load' the Stimulus Log RAM); it is sufficient to simply redefine what portions of which Memory Sets are performing these various functions. The actual physical memory that is to be used as the Stimulus Log RAM is first written to in the same way as would be done for an ECR, and then it is read from as if it were a Buffer Memory, while another part of a Memory Set "becomes" the ECR.

Figure 11:
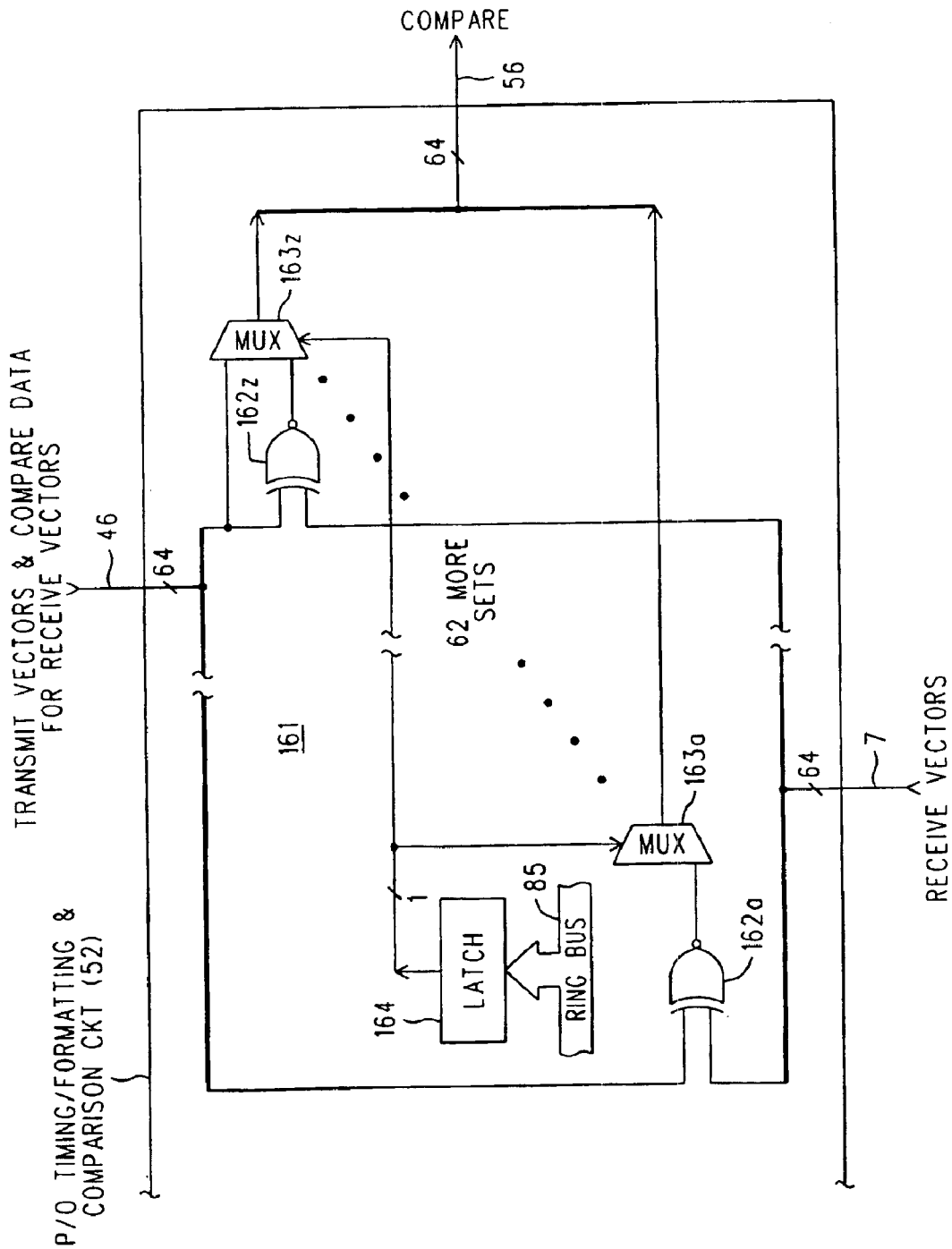
FIG. 11 is a simplified block diagram of a Transmit Vector Capture circuit that is part of the Timing/Formatting & Comparison circuit shown in FIG. 2.

Finally, refer now to FIG. 11, which is a simplified block diagram 161 of a portion of the Timing/Formatting & Comparison circuit (52) of FIG. 2. What FIG. 11 shows is circuitry that allows MUX's 163a–z to choose, all the same way or all the other, between a comparison of a receive vector with the compare data subsequent to a transmit vector and the transmit vectors by themselves. The latter choice is what allows the Stimulus Log RAM to receive those transmit vectors so that it may act as an ideal DUT that will become the source of compare data, to be used at the conclusion of part or all of DUT testing. The selection is made according to a latch 164 that is set or cleared by the Ring Bus 85. When compare data to be used to check receive vectors the actual comparison is performed by exclusive NOR gates 162a–z, whose outputs are respectively coupled to the MUX's 163a–z.

We claim:

1. A method of testing a memory under test on a memory tester, the method comprising the steps of:

(a) applying the same sequence of transmit vectors to the memory under test and to a work memory within the memory tester, the sequence of transmit vectors causing the storing of test pattern data within the memories to which it is applied, the stored test pattern data in each memory being an end result remaining stored therein after the conclusion of the application of the entire sequence of transmit vectors; and (b) subsequent to the conclusion of step (a), comparing the test pattern data content of the memory under test with the test pattern data content of the work memory.

2. A method as in claim 1 wherein the same sequence of transmit vectors is an instance of that sequence that is applied simultaneously to the memory under test and to the work memory.

3. A method as in claim 1 wherein the same sequence of transmit vectors is separate instances of that sequence that are applied at different times to the memory under test and to the work memory.

4. A method as in claim 1 wherein the work memory is a selectable portion of an interior test memory within the memory tester.

5. A method as in claim 4 further comprising the step of interleaving work memory transactions among banks of DRAM.

6. A method as in claim 4 further comprising the step of storing comparison results from step (b) in an error catch memory that is a portion of an interior test memory within the memory tester.

7. A method as in claim 6 further comprising the step of interleaving error catch memory transactions among banks of DRAM.

8. A method as in claim 4 wherein the interior test memory is comprised of a plurality of memory sets and the selectable portion is a segment of a memory set.

9. A method as in claim 8 further comprising the step of storing comparison results from step (b) in an error catch memory that is a portion of a memory set different than the memory set of which the work memory is a segment.

* * * * *